United States Patent [19]

Kalina

[11] Patent Number: 4,896,244
[45] Date of Patent: Jan. 23, 1990

[54] FEED FORWARD COMPENSATION CIRCUITRY AND SWITCHING LOGIC DRIVER WITH OVERCURRENT PROTECTION INCORPORATING SAME

[75] Inventor: Roger J. Kalina, San Diego, Calif.

[73] Assignee: General Dynamics Electronics Division, San Diego, Calif.

[21] Appl. No.: 206,524

[22] Filed: Jun. 14, 1988

Related U.S. Application Data

[63] Continuation-in-part of Ser. No. 28,729, Mar. 23, 1987, Pat. No. 4,783,714.

[51] Int. Cl.$^4$ .............................................. H02H 3/087
[52] U.S. Cl. ........................................ 361/98; 361/101; 307/296.4; 307/445; 307/471; 307/595; 307/601; 307/602; 307/606
[58] Field of Search ................. 361/93, , 97, 100, 101; 307/445, 471, 592, 595, 601, 602, 605, 606

[56] References Cited

U.S. PATENT DOCUMENTS

| | | | |
|---|---|---|---|
| 4,004,163 | 1/1977 | Spence | 307/605 X |
| 4,620,119 | 10/1986 | Williams | 307/595 |
| 4,651,252 | 7/1987 | Babinski | 361/93 |
| 4,710,842 | 12/1987 | Suzuki et al. | 361/93 |
| 4,720,758 | 1/1988 | Winslow | 361/93 |
| 4,760,291 | 7/1988 | Nakajima et al. | 207/606 X |
| 4,783,714 | 11/1988 | Kalina | 361/101 |
| 4,789,817 | 12/1982 | Asakura et al. | 361/93 |

Primary Examiner—Derek S. Jennings
Attorney, Agent, or Firm—Brown, Martin, Haller & McClain

[57] ABSTRACT

A circuit for coupling transitional energy from the output of a transmitting circuit to the input of a receiving circuit in advance of the normal connective path, which contains an inherent circuit time delay. Feed forward compensation circuitry is incorporated into a logic driver having control circuitry for receiving an input bistate data bit and providing power at an output at first and second predetermined voltage levels when an input bistate data bit is respectively of first and second states. The feed forward compensation circuitry is included in the control circuitry for modifying the response time of the control circuitry for providing output power in response to the input bistake data bit. Sensing circuitry is coupled to the control circuitry for detecting the level of current at the output and providing a corresponding current level indication. The logic driver further includes overcurrent circuitry, responsive to the current level indication, for generating an overcurrent command when the output current exceeds a predetermined level. The control circuitry is responsive to the overcurrent command for disabling the output of power at the corresponding predetermined voltage level at the output.

33 Claims, 5 Drawing Sheets

FEED FORWARD COMPENSATION CIRCUITRY AND SWITCHING LOGIC DRIVER WITH OVERCURRENT PROTECTION INCORPORATING SAME

CROSS-REFERENCE TO RELATED APPLICATIONS

This application is a continuation in part application of Ser. No. 028,729, filed Mar. 23, 1987 entitled "Switching Logic Driver with Overcurrent Protection", now U.S. Pat. No. 4,783,714 issued Nov. 8, 1988.

BACKGROUND OF THE INVENTION

I. Field of the Invention

The present invention relates to circuitry for advancing signal transmission between transmitting and receiving circuits. More specifically, the present invention relates to the implementation of a circuit for coupling transitional energy from a transmitting circuit to a receiving circuit in advance of the normal connective path which contains inherent circuit delay as embodied in a programmable logic driver circuit which further includes overcurrent protection circuitry.

II. Description of the Related Art

In conventional electronic circuits, the output of a transmitting circuit is typically coupled to the input of a receiving circuit. The normal connective path between the output of the transmitting circuit and the input of the receiving circuit typically includes an inherent circuit delay. In many cases, this circuit delay in the normal connective path does not result in optimization in overall performance in a design implementing the transmitting and receiving circuits.

Automatic test equipment (ATE) systems are currently used in the testing of electronic assemblies and subassemblies at various stages in the manufacturing process. For the testing of digital electronic equipment, the ATE system usually incorporates a logic driver for providing logic states to the unit under test. Logic drivers typically may be characterized as including a transmitting circuit responsive to input and control signals with the processed control signals transmitted to a receiving circuit via a connective path. The processed signals are coupled by the normal connective path, which includes inherent circuit delays. The receiving circuit is responsive to the processed control signals for providing an output response in the form of logic signals that are compatible with the unit under test. The ATE system in exercising the unit under test provides predetermined logic states as an input to the test unit. The ATE system then monitors the responses of the unit under test to the predetermined inputs. The response data is used in determining whether the unit under test contains a component or manufacturing related defect.

Logic drivers previously used in ATE systems have been linear-type drivers which utilize linear feedback overcurrent protection circuits if the logic driver circuit included overcurrent protection. When an electrical short occurs at the output of these types of logic driver, due to a defect in the unit under test, the driver momentarily provides a high current output until the overcurrent condition is detected by the driver's overcurrent protection circuit. Once the overcurrent condition is detected, the overcurrent protection circuit regulates the driver output current at a constant predetermined maximum value. During the overcurrent condition, the drive output current is typically higher than the maximum operating current of the driver. Therefore, significant power dissipation occurs during the overcurrent condition. Accordingly, the driver output elements must be capable of handling, on a continuous basis, higher power outputs. As a result, larger capacity heat sinks must be used for the output elements.

In a logic driver providing test signals to a unit under test, in certain cases it is important to provide in the test signals certain rise and fall time and propagation delays to adequately exercise the unit under test. In order to achieve maximum testing capability, the logic driver needs to be faster than the unit under test. The incorporation of a feed forward compensation circuit into the logic driver permits programmable signal propagation.

It is, therefore, an object of the present invention to provide novel and improved circuitry for selectively enabling the coupling of a signal output from a transmitting circuit to a receiving circuit in advance of a normal connective path.

It is yet another object of the present invention to provide a novel and improved programmable high-speed logic driver with overcurrent protection incorporating feed forward compensation.

SUMMARY OF THE INVENTION

One aspect of the present invention is a delay compensation circuit for use with a transmitting circuit and a receiving circuit coupled by a connected path having an inherent signal time delay. A capacitive means couples transitional energy, corresponding to changes in amplitude in an output signal from a transmitting circuit, to a receiving circuit. A programmable control means coupled to the capacitive means and the transmitting circuit selectively enables the coupling of the transitional energy by the capacitive means to the receiving circuit in response to a control signal.

In one application of the feed forward compensation circuitry of the present invention, a logic driver provides output power, received as input power from an external power source, that is switched between two voltage levels in response to an input bistate data bit. The logic driver includes input means for receiving an input bistate data bit and generating a control command corresponding to the state of the input bistate data bit. Feed forward means is coupled to said input means and when enabled is responsive to a change in state of an input bistate data bit for generating a transitional control command in advance of the control command. Switch means coupled to the input means receives input power and is responsive to the control command for providing output power at a first predetermined voltage level when an input bistate data bit is of a first state and at a second predetermined voltage level when an input bistate data bit is of a second state. Sense means coupled to the switch means detects the level of current and provides a corresponding current level indication. Overcurrent means is responsive to the current level indication for generating an overcurrent command when the output current exceeds a predetermined level. The switch means is further responsive to the overcurrent command for disabling the providing of output power at the corresponding predetermined voltage level.

The input means is comprised of digital logic gates and voltage translators. The logic gates provide control logic signals to the switching circuitry through the voltage translators. The voltage translators convert the voltage level of the logic gates to those required by the switching circuitry. Due to the inherent signal delays of the voltage translators, a feed forward compensation circuit is implemented to advance the signal transferred from the logic gates to the switching circuitry.

The switching means is comprised of a pair of differential amplifiers which drive either complementary MOSFET or bipolar power transistors. The transistors switch power, provided to the circuit from an external power source, between two voltage levels corresponding to the state of the input data bit.

The sense means is comprised of resistors in series between the output of the external power source and the power transistors. The voltage developed across each resistor corresponds to the current provided by the power source to the load through a corresponding transistor. The voltage developed across the sense resistors is provided to the overcurrent means which in one embodiment is a thyristor-based control circuit which directly controls the switching of the power transistor.

In the alternative embodiment of the logic driver, the overcurrent means may be implemented as a comparator based control circuitry. The comparator circuitry provide control signals to the input means for disabling the switching of the power transistors.

BRIEF DESCRIPTION OF THE DRAWINGS

These and other features, objects, and advantages of the present invention will be more fully apparent from the detailed description set forth below taken in conjunction with the drawings in which like reference characters identify correspondingly throughout and wherein.

DETAILED DESCRIPTION OF THE PREFERRED EMBODIMENTS

Figure 1:
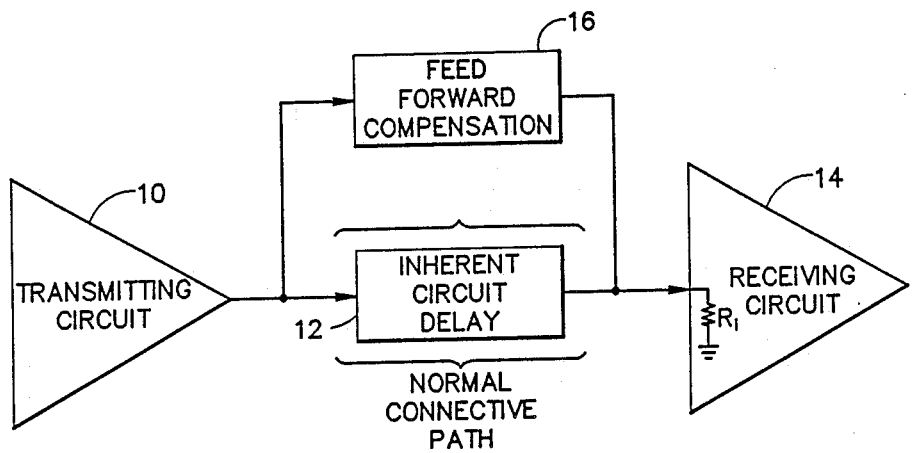
FIG. 1 is a block diagram of a feed forward compensation circuit coupled between a transmitting circuit and a receiving circuit.

Turning now to the drawings, FIG. 1 illustrates the typical environment of usage of the feed forward compensation circuit of the present invention. In FIG. 1, a transmitting circuit 10 has its output coupled via a normal connective path, as represented by block 12, to the input of receiving circuit 14 which includes an input resistance $R_i$. The normal connective path 12 typically includes circuit elements, in which certain ones are slow, or parasitic elements, such as stray capacitances or resistance. The inherent characteristics of normal connective path 12 result in a delay in the transmission of a signal from the output of the transmitting circuit 10 to the input of receiving circuit 14. To overcome the problems associated with these inherent circuit delays of normal connective path 12, a feed forward compensation circuit 16 is coupled between the output of transmitting circuit 10 and the input of receiving circuit 14.

Feed forward compensation circuit 16 provides a means for coupling transitional energy from the output of transmitting circuit 10 to the input of receiving circuit 14, in advance of the signal transmitted through the normal connective path. Feed forward compensation circuit 16 is faster in signal transmission than normal conductive path 12. Feed forward compensation circuit 16 is, therefore, utilized to speed-up signal transmission and overcome the inherent circuit delays associated with normal connective path 12.

Feed forward compensation circuit 16 is typically used to speed up the signal output from the transmitted circuit for reception by the receiving circuit 14. However, in certain applications, feed forward compensation may be required to slow down signal transmission. It is envisioned that feed forward compensation circuit 16 may be enabled or disabled, set to speed up or slow down the transmitted signal, and programmable for varying degrees of action either in the speed-up or slow-down modes or a combination thereof. Feed forward compensation circuit 16 in various applications could be implemented with switches, such as relays or field effect transistors (FET). In these cases, the actual signal is conveyed as compared to the parametric transfer as discussed with reference to FIG. 3. It is further envisioned that in the preferred embodiment that digital logic elements be implemented to provide simpler and less expensive implementations than those of direct switches or relays.

Figure 2:
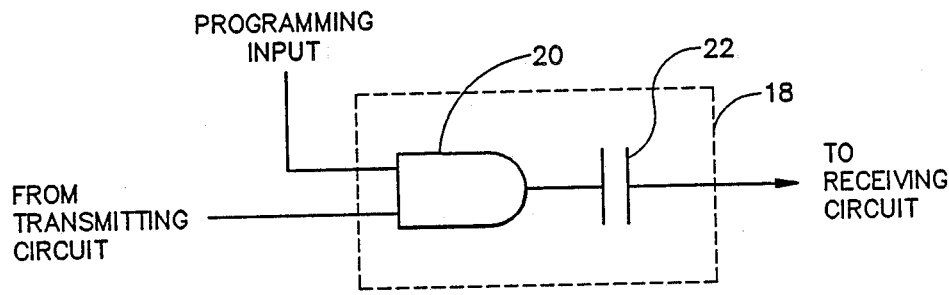
FIG. 2 is a schematical diagram illustrating an exemplary embodiment of a feed forward compensation circuit.

FIG. 2 illustrates a basic implementation of feed forward compensation circuit 16 of FIG. 1. In FIG. 2, feed forward compensation circuit 18 is comprised of an AND gate 20 having an input for receiving the signal from the transmitting circuit and another input for receiving a programming input. The output of AND gate 20 is coupled by capacitor 22 to the receiving circuit. AND gate 20 may be implemented typically as a well-known digital logic AND gate. It is necessary that the output of the transmitting circuit be signal level compatible with the driving of AND gate 20 directly or it is required that suitable translation circuitry be added. It is further required that the input of the receiving circuit have an input impedant $R_i$, that is much higher than the output impedance of AND gate 20.

AND gate 20 may be enabled or disabled respectively providing a high level, i.e. logic "1" state, input or a low level, i.e. logic "0" state at the programming input. When the programming input of AND gate 20 is disabled by a low or logic "0" signal, the output of AND gate 20 remains at a logic low level, independent of the input signal from the transmitting circuit. When AND gate 20 is disabled, receiving circuit 14 receives waveform 26 (FIG. 3) only. When AND gate 20 is enabled, the signal from the transmitting circuit causes the output state of AND gate 20 to change in phase with the transmitting circuit signal. Since AND gate 20 has a shorter delay time than the normal connective path, transitional energy is parametrically coupled to the receiving circuit in advance of energy coupled to the receiving circuit via the normal connective path. The amount of transitional energy will vary primarily with the size of the capacitor 22.

The feed forward compensation circuit is discussed herein with reference to voltages and capacitive energy coupling. It is further envisioned that using the duality theory, a current source and inductors may be utilized to achieve the same purpose.

Figure 3:
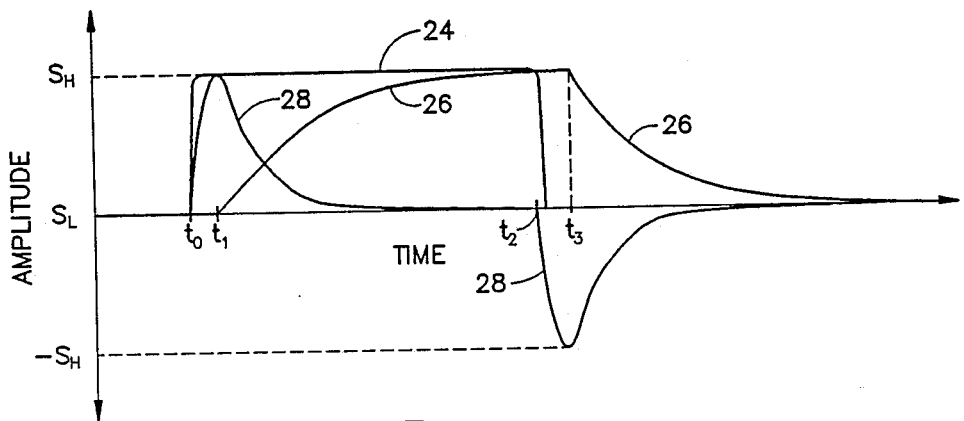
FIG. 3 is a graph illustrating signal waveforms in an exemplary implementation of a feed forward compensation circuitry.

FIG. 3 provides a graphical illustration of signal waveforms in a circuit implementing a feed forward compensation circuit coupled between the output of a transmitting circuit and a receiving circuit wherein the normal connective path includes inherent circuit delays. The signal waveforms of FIG. 3 are taken with respect to signal amplitude, typically voltage, over time. The waveforms illustrated in FIG. 3 are merely representative waveforms and actual amplitude level may vary. Curve 24 illustrates the output waveform from a transmitting circuit, such as transmitting circuit 10 of FIG. 1. At a time prior to $t_0$ the output of transmitting circuit 10 is a low level or logic "0" state. At time $t_0$ the output of transmitting circuit 10 changes state to a high or logic "1" state. The output of transmitting circuit 10 as input to receiving circuit 14 through the normal connective path is illustrated by curve 26. Due to the inherent circuit delays in the normal connective path, during the time of $t_0-t_1$, no signal is coupled to receiving circuit 14 via the normal connective path. At time $t_1$, the transmitting circuit output signal transmitted via the normal connective path is coupled to the input to receiving circuit 14. At time $t_1$, the signal received at receiving circuit 14 begins increasing in amplitude towards a logic "1" state corresponding to the signal output state of transmitting circuit 10.

With the addition of feed forward compensation circuit 18 of FIG. 2, the transmitted signal waveform 24 is input to AND gate 20. With the programming input of AND gate 20 set at the logic "1" state, enabling AND gate 20, the output of AND gate 20 is in phase with the input from transmitting circuit 10. AND gate 20 is used for connecting and disconnecting capacitor 22 to the input of receiving circuit 14 with capacitor 22 coupling energy as a result of the transition of the output signal from transmitting circuit 10. Feed forward compensation circuit 18 responds to the transition of waveform 24 at time $t_0$. The response waveform is illustrated by waveform 28. At time $t_0$, AND gate 20 changes from a logic "0" to a logic "1" state thereby enabling the coupling of energy, at a relatively rapid rate to the input of receiving circuit 14, such that receiving circuit 14 has an input corresponding to the state of the signal output from transmitting circuit 10. With the input of receiving circuit 14 seeing the summation of waveforms 26 and 28, the resultant waveform is closer to the waveform 24 than waveform 26 itself. As capacitor 22 is made larger in value, the decay constant ($\tau=R_iC$) will increase thereby providing additional energy for compensating the delayed signal received via the normal connective path.

Similarly, at time $t_2$, the output of the transmitting circuit changes from the logic "1" state to a logic "0" state as further illustrated by waveform 24. In the feed forward compensation circuit 18, the transmitted signal waveform 24 is coupled to AND gate 20. With AND gate 20 enabled, the output of AND gate 20 is in phase with the input from transmitting circuit 10. Feed forward compensation circuit 18 responds at time $t_2$ to the transition of waveform 24. The response waveform 28 output from feed forward compensation circuit is correspondingly a negative pulse. At time $t_2$, the output of AND gate 20 changes from the logic "1" to a logic "0" thereby enabling the coupling of energy from receiving circuit 14 through capacitor 22. Due to the inherent delays in the normal connective path, waveform 26 remains high until time $t_3$. The sum of the signals via the normal connective path and the feed forward compensation circuit present a logic "0" input to the receiving circuit from time $t_2$ on. At time $t_3$, waveform 26 begins changing state by decaying to the low level, along with the decaying of waveform 28 to the low level. Accordingly, the sum of waveforms 26 and 28 results in a waveform close to that of waveform 24.

Figure 4:
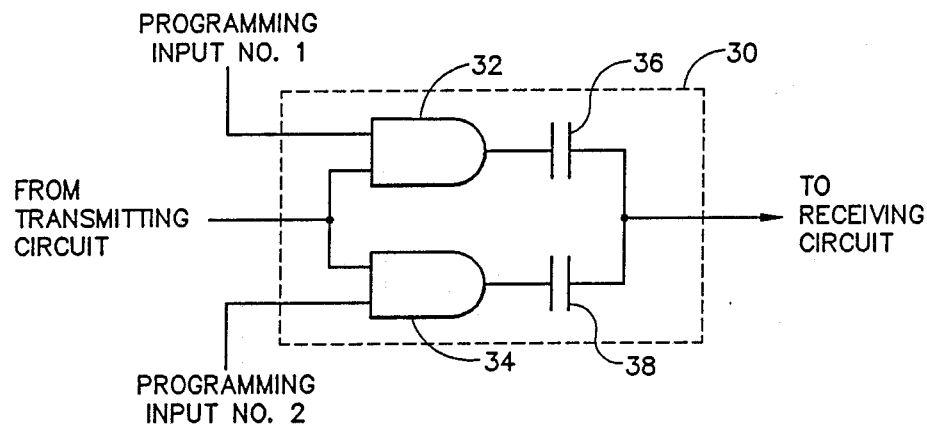
FIG. 4 illustrates a schematic diagram of an alternate exemplary embodiment of a feed forward compensation circuit.

The feed forward compensation circuitry may be implemented in many varying forms using the logic gates and capacitor coupling for providing varying "degrees of action," i.e. levels of inherent circuit delay speed-up. FIG. 4 illustrates an alternate embodiment of feed forward compensation circuitry in which varying degrees of action may be programmed. In FIG. 4, feed forward compensation circuitry 30 is comprised of a pair of logic AND gates 32 and 34 each having an input for receiving the output from the transmitting circuit. Similarly, each of AND gates 32 and 34 include a programming input with AND gate 32 including programming input no. 1 and AND gate 34 including programming input no 2. The outputs of AND gates 32 and 34 are respectively coupled by capacitors 36 and 38 to the receiving circuit. The circuit in FIG. 4 may be programmed in binary form, i.e. powers of two fashion, according to Table 1.

TABLE 1

| Degree of Action | Programming Input No. 1 | Programming Input No. 2 |
|---|---|---|
| 1 | 0 | 0 |
| 2 | 0 | 1 |
| 3 | 1 | 0 |
| 4 | 1 | 1 |

GATE DISABLED = LOGIC 0
GATE ENABLED = LOGIC 1

When an AND gate is disabled, the output stays at a logic "0" level independent of state of the input signal received from the transmitting circuit. When an AND gate is disabled, the capacitor connected to the output of the disabled AND gate is essentially at ground equivalently across $R_i$ of the receiving circuit. The result of having one or both of AND gates 32 and 34 disabled forms a capacitive voltage divider which must be taken into account when selecting values for capacitors 36 and 38. It is further envisioned that the programmability as disclosed with reference to FIG. 4 could be extended to more levels. For example, one or more similar circuits may be added to yield additional degrees of action. For example, the addition of one additional and gate and capacitor would yield a total of eight degrees of action.

Figure 5:
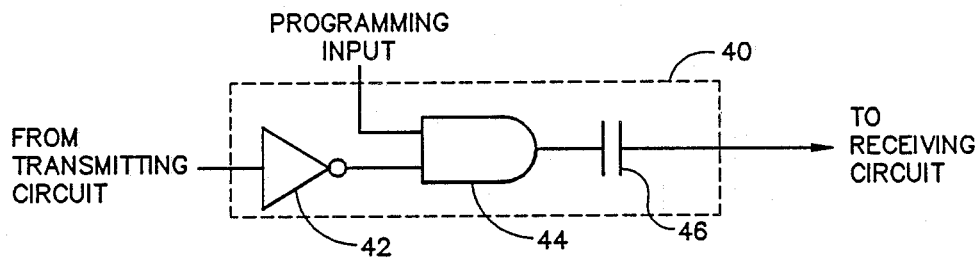
FIG. 5 illustrates a schematic diagram of another alternate exemplary embodiment of a feed forward compensation circuit.

It is further envisioned that the signal output from transmitting circuit may be slowed down by coupling transitional energy "out of phase" from the transmitting circuit to the receiving circuit. One illustrative embodiment for accomplishing the coupling of transitional energy out of phase from the transmitting circuit to the receiving circuit is illustrated in FIG. 5. In FIG. 5, a compensation circuit for slowing down the transmitted signal includes inverter 42 having an input for receiving the signal from the transmitting circuit and an output coupled to an input of AND gate 44. The other input of AND gate 44 is a programming input. The output of AND gate 44 is coupled through capacitor 46 to the receiving circuit. With the programming input of AND gate 44 at a logic "0" state, AND gate 44 is disabled from controlling the coupling of transitional energy out of phase from the transmitting circuit to the receiving circuit.

When the programming input is at a logic "1" state, AND gate 44 is enabled. Upon enabling, AND gate 44 responds to the transition of signals received from the transmitting circuit via inverter 42. When the output from the transmitting circuit changes from logic "0" to logic "1", as illustrated by waveform 24 in FIG. 3, the output of inverter changes from a logic "1" to a logic "0". Accordingly, AND gate 44 provides an output waveform similar to waveform 28 of FIG. 3, only being inverted. When the output waveforms from compensation circuit 40 and the normal conductive path are summed together, the net effect will slow down the transmitted signal more than the signal transmitted via the normal connective path alone. It is further envisioned that the configuration of the compensation circuit as illustrated in FIG. 5 may be extended to programming degrees of action as discussed with reference to FIG. 4.

Figure 6:
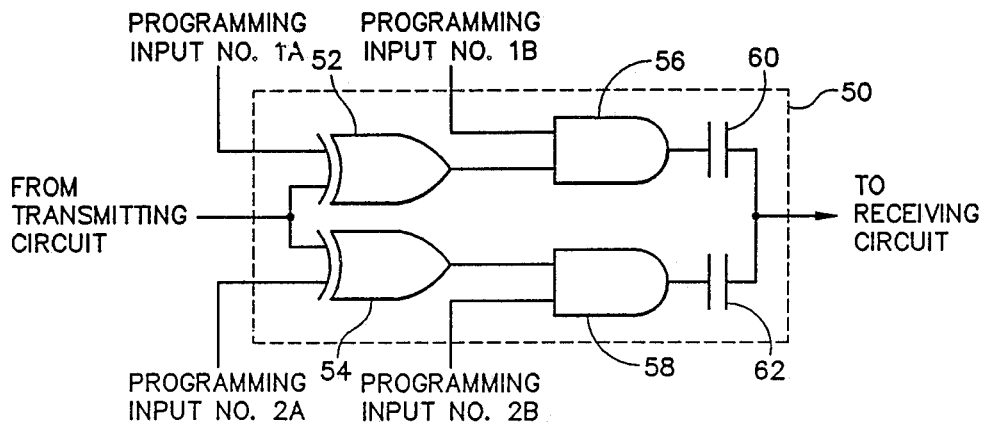
FIG. 6 illustrates a schematic diagram of yet another alternate exemplary embodiment of a feed forward compensation circuit.

FIG. 6 illustrates an embodiment of the feed forward compensation circuit that incorporates programmable in-phase speed-up, and out-of-phase slow-down degrees of actions. Compensation circuit 50 of FIG. 6 is comprised of a pair of EXCLUSIVE OR gates 52 and 54, each having an input for receiving an input from a transmitting circuit. EXCLUSIVE OR gate 52 includes another input labeled programming input no. 1A. Similarly, EXCLUSIVE OR gate 54 includes an input labeled programming input no. 2A. The outputs of EXCLUSIVE OR gates 52 and 54 are each respectively coupled to an input of AND gates 56 and 58. AND gate 56 further includes an additional input labeled programming input no. 1B while AND gate 58 also includes an input labeled programming input no. 2B. The outputs of AND gates 56 and 58 are respectively coupled through capacitors 60 and 62 to the receiving circuit. In the embodiment of FIG. 6, EXCLUSIVE OR gate 52, AND gate 56 and capacitor 60 may be characterized as a first channel while EXCLUSIVE OR gate 54, AND gate 58 and capacitor 62 form a second channel. EXCLUSIVE OR gates 52 and 54 are utilized so as to function as programmable inverters.

Programming inputs nos. 1A and 2A may be independently set at a logic "0" which corresponds to an in-phase transmission of the transmitting circuit signal or a logic "1" which corresponds to an out-of-phase transmission of signal through the respective EXCLUSIVE OR gate. Furthermore, programming inputs no. IB and 2B are independently set at either a logic "0" or logic "1" to respectively disable or enable the respective AND gates. It is envisioned that any combination of programming inputs logic signals may be used, including one channel programmed for in-phase transmission while the other channel is programmed for out of phase signal transmission. It is preferred that different sized capacitors be used such that the transitional energy will not be cancelled out. Use of in-phase and out-of-phase channels can lead to finer resolution of programming capability, especially if the circuit of FIG. 6 is extended to include additional channels. Using the circuit elements as discussed with reference to FIGS. 2, 4-6, many variations in programmable resolution is possible.

Utilizing the feed forward compensation as discussed with reference to FIGS. 1-6, feed forward compensation may be readily implemented into a circuit which fits within the description of FIG. 1. One such exemplary embodiment is that of a switching logic driver.

Figure 7:
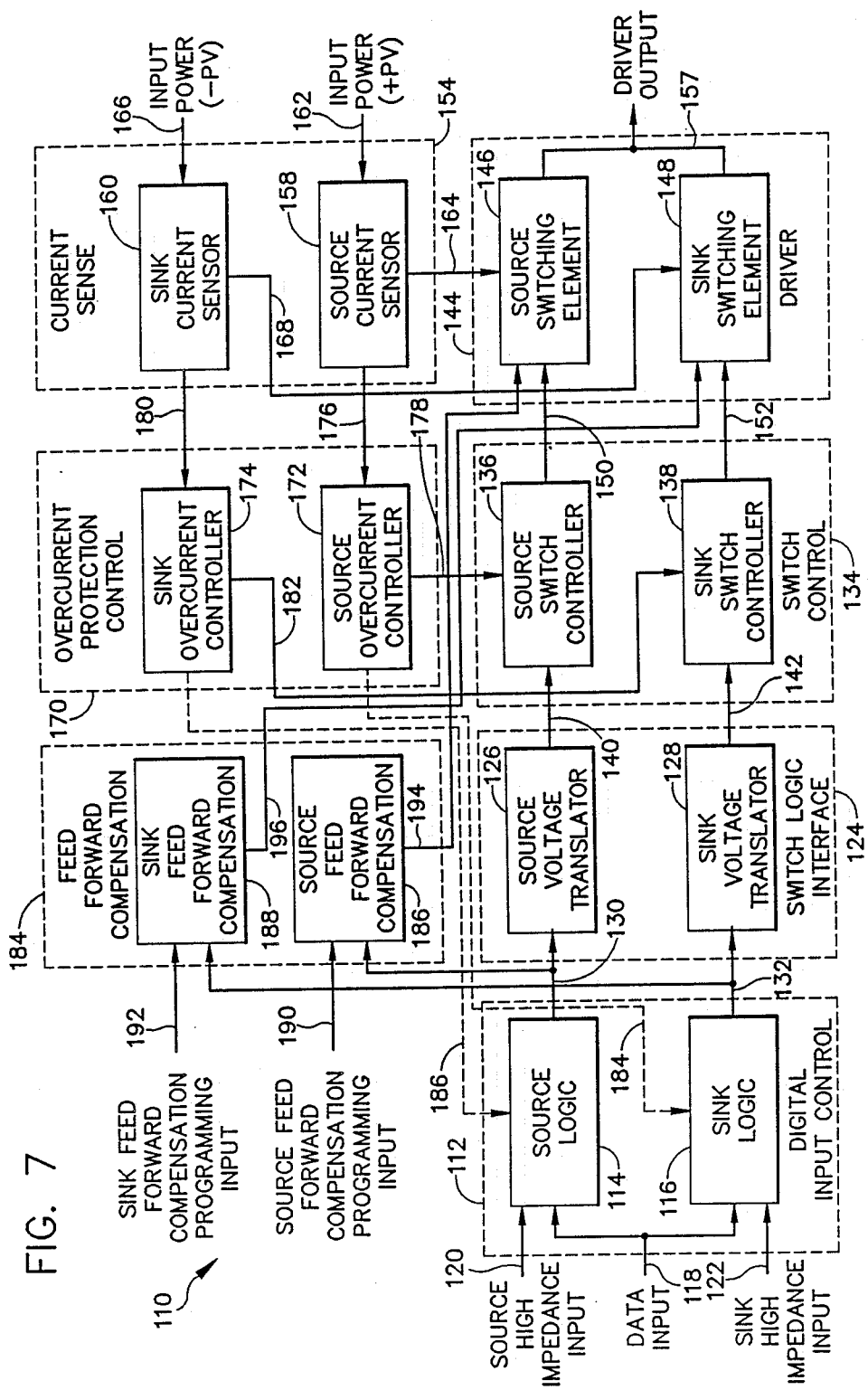
FIG. 7 is a block diagram of the switching logic driver with overcurrent protection incorporating feed forward compensation.

FIG. 7 illustrates in block diagram form switching logic driver 110 which includes overcurrent protection and feed forward compensation. Switching logic driver 110 is comprised of digital input control section 112, switch logic interface section 124, switch control section 134, driver section 144, current sense section 154, overcurrent protection control section 170 and feed forward compensation section 184.

Digital input control section 112 is comprised of source logic 114 and sink logic 116. Bistate data bit are provided from an external logic bit generator (not shown) as an input to digital input control section 112. The input data bits are provided on line 118 as inputs to both source logic 114 and sink logic 116. Source logic 114 and sink logic 116 also respectively receive externally generated bistate control signals, source high impedance (HI-Z) input signal and sink high impedance (HI-Z) input signal, on lines 120 and 122 from an external source (not shown). These control signals, whose operation is described in greater detail later herein, are each used to disable a switching element in driver section 144.

Source logic 114 and sink logic 116 are responsive to the state of an input data bit and the HI-Z input signals so as to provide a corresponding bistate logic signal. Source logic 114 in response to an input data bit and a source HI-Z input signal provides a bistate source logic signal to switch interface section 124. Similarly, sink logic 116 in response to an input data bit and a sink HI-Z input signal provides a bistate sink logic signal to switch interface section 124.

Switch interface section 124 is comprised of a pair of voltage translators, source voltage translator 126 and sink voltage translator 128. The source logic signal provided from the output of source logic 114 is coupled to the input of source voltage translator 126 by line 130. Similarly, the sink logic signal provided from the output of sink logic 116 is coupled to the input of sink voltage translator 126 by line 132.

Source voltage translator 126 and sink voltage translator 128 adjust the voltage levels of the logic signals output from the logic gates of source logic 114 and sink logic 116. The voltage levels of the output logic signals are adjusted to the operational voltage levels necessary to drive the following switching circuitry. The converted logic signals output from source voltage translator 126 and sink voltage translator 128 are input to switch control section 134. Switch control section 134 is comprised of source switch controller 136 and sink switch controller 138.

The converted logic signal output from source voltage translator 126 is coupled on line 140 to a switch control input of source switch controller 136. Similarly, the converted logic signal output from sink voltage translator 128 is coupled on line 142 to a switch control input of sink switch controller 138. Source switch controller 136 and sink switch controller 138, in response to respectively received converted source and sink logic signal, provide corresponding switch control signals to driver section 144.

Driver section 144 is comprised of a pair of complementary switching elements, source switching element 146 and sink switching element 148. The source switch control signal output from source switch controller 136 is coupled on line 150 to a control input of source switching element 146. Similarly, the sink switch control signal output from sink switch controller 138 is coupled on line 152 to a control input of sink switching element 148. Source switching element 146 and sink switching element 148 are each provided with power from an external power source (not shown). Input power is provided to driver section 144 through current sense section 154.

The external power source includes a positive programmable power supply (not shown) that provides the input voltage (+PV) and corresponding current to source switching element 146. Also included in the external power source is a negative programmable power supply (not shown) that provides the input voltage (−PV) and corresponding current to sink switching element 148. Therefore, depending upon the state of the input data bit as input to digital input control section 112, the driver section output assumes a corresponding positive or negative programmed voltage. A positive voltage output is from source switching element 146 while a negative voltage output is output from sink switching element 148.

Although "normal" operation is defined as output positive when input data bit is high, and output negative when input data bit is low, it is feasible and required in some applications that "+PV" be a negative voltage and/or "−PV" be a positive voltage. In those applications where the input voltages +PV and −PV are both positive voltages, the voltage +PV is at a greater positive potential then the voltage −PV. Similarly, where the input voltages +PV and −PV are both negative voltages the voltage −PV is to be at a greater negative potential than the voltage +PV.

When the input source HI-Z signal is in one state there is no effect on the source switching element. However, when the input source HI-Z signal is in the other state, irrespective of the state of the input data bit, the source switching element is disabled or "turned off" so as to provide a high impedance output. Similarly, when the input sink HI-Z signal is in one state there is no effect on the sink switching element. However, when the input sink HI-Z signal is in the other state, irrespective of the state of the input data bit, the sink switching element is disabled or "turned off" so as to provide a high impedance output.

Current sense section 154 is comprised of a pair of current sensors, source current sensor 158 and sink current sensor 160. The input voltage +PV from the positive programmable power supply is coupled on line 162 to an input of source current sensor 158. Source current sensor 158 couples the power from the positive programmable power supply on line 164 to a power input of source switching element 146. Similarly, the input voltage −PV from the negative programmable power supply is coupled on line 166 to an input of sink current sensor 160. Sink current sensor 160 couples the power from the negative programmable power supply on line 168 to a power input of sink switching element 148. Source current sensor 158 and sink current sensor 160 respectively sense the current flow to source switching element 146 and sink switching element 148 and generate corresponding current level signals. The current level signals are coupled to overcurrent protection control section 170.

Overcurrent protection control section 170 is comprised of a pair of overcurrent controllers, source overcurrent controller 172 and sink overcurrent controller 174. Source current sensor 158 provides the source current level signal on line 176 to an input of source overcurrent controller 172. Source overcurrent controller 172 monitors the source current level signal for an indication of an overcurrent condition in the current flowing through source switching element 46. An overcurrent condition arises when excessive current flows through switching element 146 to a load coupled to the driver output. The overcurrent condition typically occurs when there is an electrical short circuit in the load.

When a source overcurrent condition occurs, source overcurrent controller 172 provides a source overcurrent signal that is coupled on line 178 to an overcurrent control input of source switch controller 136. Source switch controller 136, in response to the source overcurrent signal, provides a source switch signal to source switching element 146 which disables or turns off source switching element 146. Therefore, source switching element 146 goes to a high impedance output state. With source switching element 146 disabled, there is no current flowing on line 56 to the driver output which further results in no power dissipation in switching element 146.

Sink overcurrent controller 174 operates in a similar manner to source overcurrent controller 172. Sink current sensor 160 provides the sink current level signal on line 180 to an input of sink overcurrent controller 174. Sink overcurrent controller 174 monitors the sink current level signal for an indication of an overcurrent condition in the current flowing through sink switching element 148. An overcurrent condition arises when excessive current flows through sink switching element 148 to a load coupled to the driver output. Again the overcurrent condition typically occurs when there is a short circuit in the load.

When a sink overcurrent condition occurs, sink overcurrent controller 174 provides a sink overcurrent condition signal that is coupled on line 182 to an overcurrent control input of sink switch controller 138. Sink switch controller 138, in response to the overcurrent signal, provides a sink switch signal to sink switching element 148 which disables or "turns off" sink switching element 148. Therefore, sink switching element 148 goes to a high impedance output state. With sink switching element 148 disabled, there is no current flowing on line 157 to the driver output which further results in no power dissipation in switching element 148.

In an alternate embodiment, source overcurrent controller 172 and sink overcurrent controller 174 each output a corresponding overcurrent signal respectively on lines 184 and 186 to a respective overcurrent control input of source logic 114 and sink logic 116. Source logic 114 and sink logic 116 in response to a respective overcurrent signal provide an output signal which is propagated through switch interface section 124, switch control section 134 to driver section 144 so as to disable the corresponding switching element.

In either embodiment, the input bistate source HI-Z signal is coupled to the source HI-Z inputs of source logic 114. Similarly, the input bistate sink HI-Z signal is coupled to the sink HI-Z input of sink logic 116. Source logic 114 or sink logic 116 in response to a predetermined state of the input bistate HI-Z signal modifies the state of the source or sink logic signal so as to disable the corresponding switching element. The source and sink logic signals are coupled through switch interface section 124 to switch control section 134 which controls the on-off state of a corresponding switching element of driver section 144. A disabled switching element provides a high impedance output irrespective of the state of the input data bit. In effect, the source and sink HI-Z signals override the input data in controlling the on-off state of the switching element.

Normal operation of the logic driver is typically such that a "high" or logic "1" data bit input results in the source switching element being turned on with the sink switching element turned off. In this condition a positive voltage appears at the driver output with the sink switching element in a high impedance output state. Similarly, when a "low" or logic "0" data bit is input to the logic driver, the sink switching element is turned on and the source switching element is turned off. In this condition a negative or lower level voltage appears at the driver output with the source switching element in the high impedance state.

Feed forward compensation 184 is comprised of a pair of feed forward compensation circuits, source feed forward compensation 186 and sink feed forward compensation 188. Source feed forward compensation 186 includes a source feed forward compensation programming input 190 for setting the enabling/disabling and degree of action of source feed forward compensation. Sink feed forward compensation 188 includes a sink feed forward compensation programming input 192 for determining the enabling/disabling and degree of action of sink feed forward compensation. The source logic signal provided from the output of source logic 114 is coupled to the input of source feed forward compensation 186 by line 130. The output of source feed forward compensation 186 is provided by line 194 to an input of source switching element 146. Similarly, the sink logic signal provided from the output of sink logic 116 is coupled to the input of sink feed forward compensation 188 by line 132. The output from sink feed forward compensation 188 is provided by line 196 to an input of sink switching element 48. Source feed forward compensation 186 and sink feed forward compensation 188 in response to the respectively input logic signals couple transitional energy, typically delayed by switch logic interface 124 and switch control 134, directly to driver 144.

It is an important aspect of the present invention that the output driver elements operate in a high-speed switching mode, as opposed to a linear mode, and are under feedback control. As a result of the feedback control, a cut-off in output current from the respective switching element occurs during an overcurrent condition. No other logic driver has included overcurrent feedback control that cuts off the driver output current during an overcurrent condition. The cut-off current limiting feature, in concert with high-speed switching-mode operation, distinguishes the present invention over conventional logic driver circuits.

Summarizing conventional logic driver overcurrent protection circuits, these circuits typically regulate the output current to a predetermined maximum value. The predetermined maximum value is generally higher than the maximum operating current level of the switching element. Therefore, power dissipation is highest when a short circuit condition occurs at the driver output. Therefore, the driver output elements must be selected with high power components which require greater heat sinking. In addition, conventional logic drivers fail to implement techniques which optimize output response time.

The present invention by using complementary output switching elements under feedback control eliminates the constant output current during an overcurrent condition. The embodiments of the present invention virtually eliminate, other than momentarily, the high output current normally associated with the overcurrent condition. As such, low power switching elements and with low heat sinking requirements ma be implemented. A logic driver constructed using the teachings of the present invention permits simplicity in design with low power component and ultimately a low component count. Furthermore, utilization of feed forward compensation enables programmable response time characteristics at the driver output to the data input.

Figure 8:
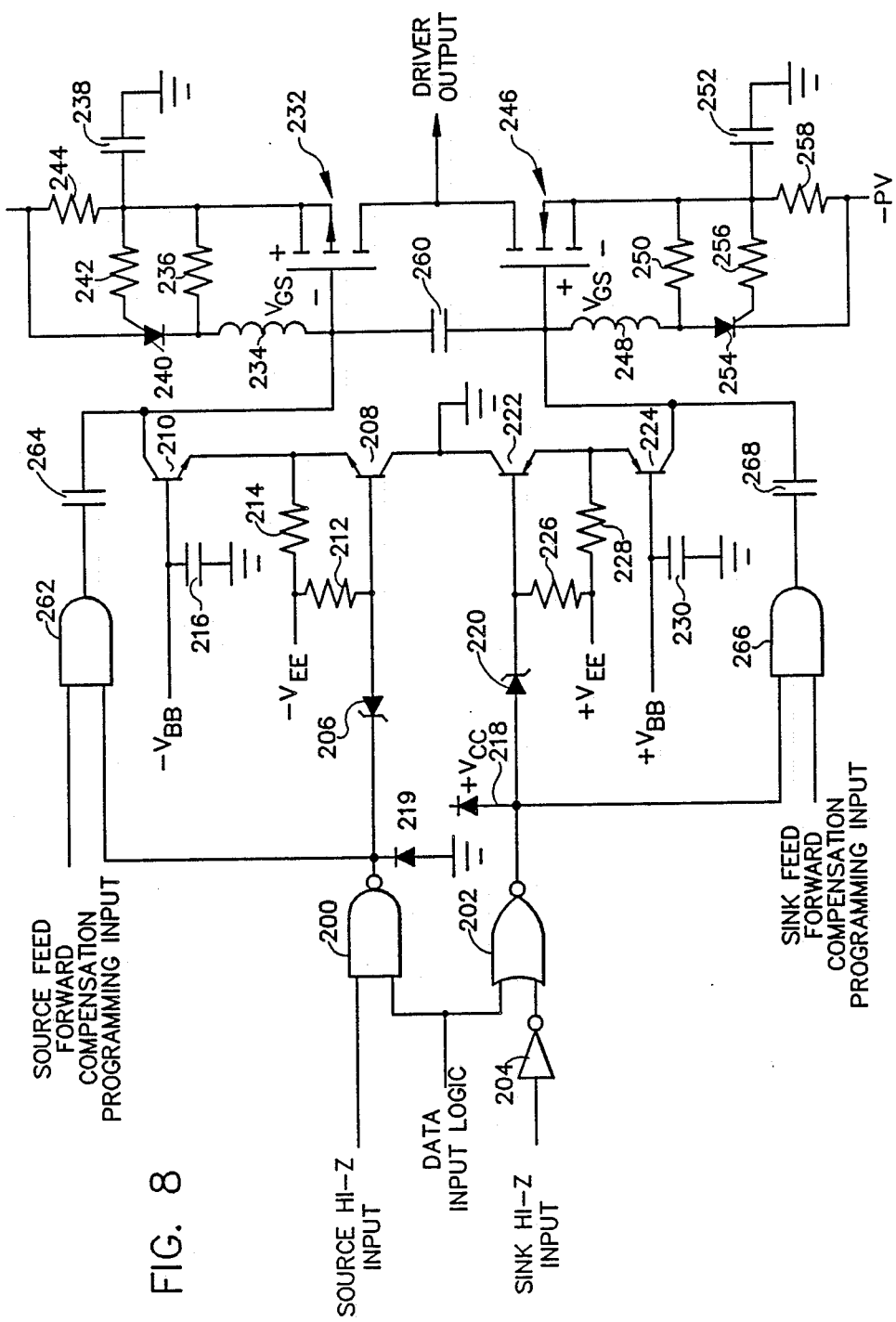
FIG. 8 is a schematical diagram of one embodiment of a switching logic driver with overcurrent protection and feed forward compensation.

FIG. 8 is a schematical diagram of one embodiment of the present invention. The logic driver of FIG. 8 uses MOSFET complementary transistors as the switching elements in combination with thyristor controlled overcurrent protection circuitry. Input bistate data bits from an external logic bit generator are each provided simultaneously to a respective input of NAND gate 200 and NOR gate 202. An input bistate source HI-Z signal is coupled to the other input of NAND gate 200 while the input bistate sink HI-Z signal is coupled through invertor 204 to the other input of NOR gate 202. NAND gate 200, NOR gate 202 and invertor 204 provide the necessary logic in the digital input control section for performing boolean logic operations on the input bistate data and HI-Z input signals. The state of the output bistate signals from NAND gate 200 and NOR gate 202 are the source of the control signals which command the driver output circuitry.

The output of NAND gate 200 is connected to the cathode of diode 219. The anode of diode 219 is coupled to ground. Diode 219 is used at the output of NAND gate 200 if the device implemented as NAND gate 200 can not source current when the gate output is in the low or logic "0" state.

The output of NAND gate 200 is also coupled to the cathode of zener diode 206. The anode of zener diode 206 is coupled to the base of transistor 208. Transistors 208 and 210 and their associated bias circuitry form a differential amplifier. Zener diode 206 provides the necessary source voltage translation function while the differential amplifier provides the source switch control function.

The base of transistor 208 is coupled through bias resistor 212 to an external power supply (not shown) which provides the negative reference voltage $-V_{EE}$. The emitter of transistor 208 is also coupled to the reference voltage $-V_{EE}$ through bias resistor 214. The collector of transistor 208 is coupled to ground and another differential amplifier as described later.

The emitter of transistor 210 is coupled to the emitter transistor 208 with the reference voltage $-V_{EE}$ being provided to the emitter of transistor 210 through resistor 214. The base of transistor 210 is coupled to an external power supply (not shown) which provides the negative reference voltage $-V_{BB}$. The base of transistor 210 is also coupled to ground through filter capacitor 216. The collector of transistor 210 is coupled to the source driver circuitry, as described later, and a source feed forward compensation circuit.

The source feed forward compensation circuit includes AND gate 262 having one input coupled to the output of NAND gate 200. AND gate 262 has its other input for receiving a bistate source feed forward compensation signal for enabling or disabling the source feed forward compensation circuit. The output of AND gate 262 is coupled to the collector of transistor 210 through capacitor 264. The source feed forward compensation circuit when enabled, provides programmable enablement/disablement for the coupling of transitional energy from the output of a transmitting circuit, i.e. NAND gate 200, to a receiving circuit, i.e. transistor 232 and associated switching and bias circuitry. The inherent circuit delays present in the normal connective path elements, i.e. zener diode 206, resistors 212 and 214, capacitor 216 and transistors 208 and 210 may then be compensated for by the addition of the source feed forward compensation circuit. Although illustrated in FIG. 8 as including the basic feed forward compensation circuit as disclosed with reference to FIG. 2, it is envisioned that various other source feed forward compensation circuits may be implemented such as those illustrated in FIGS. 2, 4-6.

The output of NOR gate 202 is connected to the anode of tie-up diode 218. The cathode of diode 218 is coupled to an external power supply (not shown) which provides the positive reference voltage $+V_{CC}$. Diode 218 is used at the output of NOR gate 202 so as to limit positive voltage to a diode drop above $+V_{CC}$. This is required if the NOR gate 202 is implemented with a device that cannot sink current in the logic "1" or high state.

The output of NOR gate 202 is also coupled to the anode of zener diode 220. The cathode of zener diode 220 is coupled to the base of transistor 222. Transistors 222 and 224 and their associated bias circuitry form a differential amplifier. Zener diode 220 provides the necessary sink voltage translation function while the differential amplifier provides the sink switch control function.

The base of transistor 222 is coupled through bias resistor 226 to the reference voltage $+V_{EE}$ provided by an external power supply (not shown). In addition, the reference voltage $+V_{EE}$ is coupled through resistor 228 to the emitters of transistors 222 and 224 which are tied together. The collector of transistor 222 is coupled to ground and the collector of transistor 208.

The base of transistor 224 is coupled to an external power supply (not shown) which provides the reference voltage $+V_{BB}$. The base of transistor 224 is also coupled to ground through filter capacitor 216. The collector of transistor 224 is coupled to the sink driver circuitry, described later, and a sink feed forward compensation circuit.

The sink feed forward compensation circuit includes AND gate 266 having one input coupled to the output of NOR gate 202. AND gate 266 has its other input for receiving a bistate sink feed forward compensation signal for enabling or disabling the sink feed forward compensation circuit. The output of NOR gate 202 is coupled to the collector of transistor 224 through capacitor 268. The sink feed forward compensation circuit when enabled, provides programmable enablement/disablement for providing coupling of transitional energy from the output of a transmitting circuit, i.e. NOR gate 202, to a receiving circuit, i.e. transistor 246 and associated switching and bias circuitry. The inherent circuit delays present in the normal connective path elements, i.e. zener diode 220, resistors 226 and 228, capacitor 230 and transistors 222 and 224 may then be compensated for by the addition of the sink feed forward compensation circuit. Although illustrated in FIG. 8 as the basic feed forward compensation circuit disclosed with reference to FIG. 2, it is envisioned that various other source feed forward compensation circuits may be implemented such as those illustrated in FIGS. 2, 4-6.

The source differential amplifier circuitry is coupled to the source switching element which is comprised of drive transistor 232. In particular, the collector of transistor 210 of the source differential amplifier circuitry is coupled to the gate of a P-type MOSFET transistor used as driver transistor 232. The gate of transistor 232 is also coupled to one end of inductor 234. The other end of inductor 234 is coupled through resistor 236 to the source of transistor 232. The source of transistor 232 is coupled through capacitor 238 to ground. The other end of inductor 234 is coupled to the cathode of thyristor 240. The anode of thyristor 240 coupled to a programmable positive voltage power supply (not shown) which provides the reference voltage $+PV$.

The gate of thyristor 240 is coupled through resistor 242 to the source of transistor 232. The source of transistor 232 is also coupled through sense resistor 244 to the reference voltage $+PV$. Thyristor 240 is implemented in the circuit as the source overcurrent protection controller while sense resistor 244 functions as the source current sensor.

The sink differential amplifier circuitry is coupled to the sink switching element which is comprised of drive transistor 246. The collector of transistor 224 of the sink differential amplifier circuitry is coupled to the gate of an N-type MOSFET transistor used as drive transistor 246. The gate of transistor 246 is coupled to one end of inductor 248. The other end of inductor 248 is coupled through resistor 250 to the source of transistor 246. The source of transistor 246 is coupled through capacitor 252 to ground. The other end of inductor 248 is coupled to the anode of thyristor 254. The cathode of thyristor 254 coupled to a programmable negative voltage power supply (not shown) which provides the reference voltage $-PV$.

The gate of thyristor 254 is coupled through resistor 256 to the source of transistor 246. The source of transistor 246 is also coupled through sense resistor 258 to the reference voltage $-PV$. Thyristor 254 is implemented in the circuit as the sink overcurrent protection controller while sense resistor 258 functions as the sink current sensor.

The gate of transistor 232 is coupled to the gate of transistor 246 by capacitor 260. Capacitor 260 is used for switching transition smoothing. The drain of transistor 232 and the drain of transistor 246 are coupled together to form the driver output.

The circuit of FIG. 8 utilizes MOSFET complementary transistors 232 and 246 as the driver output switching elements. Transistors 232 and 246 are driven by the output of transistors 210 and 224 of the source and sink differential amplifiers respectively comprised of transistor pair 208, 210, and transistor pair 222, 224. The differential amplifier transistors are controlled by the state of the input data bits and HI-Z signals, input to the circuit through the logic gates and coupled through zener diodes 206 and 220. Zener diodes 206 and 220 provide the voltage translation function between the operational voltages of the logic gates and the operational voltages of the differential amplifiers.

The current provided by each of the differential amplifier transistors 210 and 224 is converted to a respective gate to source voltage ($V_{GS}$). These gate to source voltages are respectively developed across resistors 236 and 250 which are respectively coupled across the gates and sources of transistors 232 and 246. The voltage $V_{GS}$ controls the conduction, i.e. switching on and off, of transistors 232 and 246.

Inductors 234 and 248 provide AC overdrive to transistors 232 and 246 during the switching transitions to enhance switching speed. It is preferred that the multiple of values of inductor 234 and resistor 236 be selected larger than the multiple of the values of inductor 248 and resistor 250. This type of component selection permits a larger gate to source voltage, $V_{GS}$, to be generated for transistor 232. This larger drive voltage is to compensate for the inherent lower efficiency of the P-type FET transistor used for transistor 232 as compared to the N-type FET transistor used for transistor 246.

Capacitor 260 provides dynamic cross-coupling between transistors 232 and 246 to smooth the turn on and turn off transitions. In addition, capacitor 260 equalizes the input to output propagation delays for both positive and negative transitions.

The overcurrent protection circuit of FIG. 8 utilizes thyristors 240 and 254 as the primary overcurrent controlling elements. When an overcurrent condition occurs, thyristors 240 or 254 trigger on. Thyristors 240 and 254 trigger on or begin conducting as a result of the respective increase in the voltage drop across sense resistors 144 and 158. When a thyristor begins conducting it shunts current away from a corresponding gate bias resistor, resistor 136 or resistor 150. By shunting the current away from resistor 136 or resistor 150, the corresponding gate to source voltage $V_{GS}$ developed across the resistor falls below the transistor gate threshold voltage of the respective one of transistors 132 or 146. When the gate to source voltage $V_{GS}$ falls below the transistor gate threshold voltage, the transistor turns off. The thyristor will remain latched on in the conduction state, thereby keeping the respective one of transistors 132 and 146 turned off, until a next input data bit of a different state occurs or, a source or a sink HI-Z input signal is provided to switch the transistor to a high impedance state or off state.

When the source or sink switching elements are disabled by the change in state of the input data bit or a source or sink HI-Z input signal, the current flowing through the thyristor will fall below the minimum holding current and the thyristor will turn off. The source and sink HI-Z inputs are normally held "high" level or logic "1" for normal operation of the circuit. By normal operation of the circuit, it is intended that the voltage of the driver output is a positive voltage when the state of the input data bit is "high" level or logic "1", and a negative voltage when the input data bit is "low" level or logic "0". The circuitry returns to normal operation after an overcurrent condition occurs when the input data bit changes state and the overcurrent condition is removed. In effect, the overcurrent protection circuitry is self-resetting.

Figure 9:
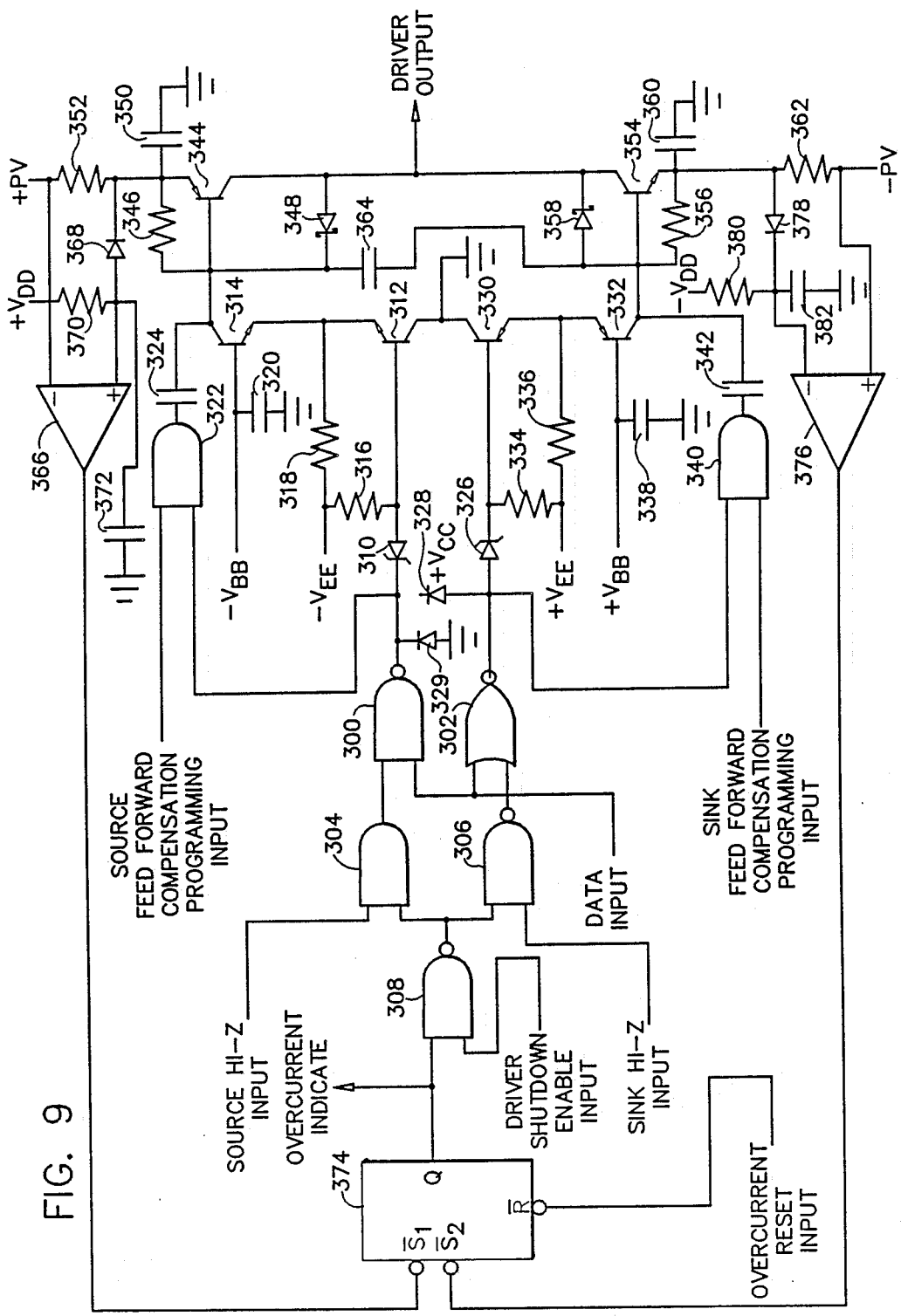
FIG. 9 is a schematical diagram of an alternate embodiment of a switching logic driver with overcurrent protection and feed forward compensation.

FIG. 9 illustrates an alternate embodiment of the switching logic driver with overcurrent protection incorporating feed forward compensation. The overcurrent protection scheme utilized in FIG. 9 corresponds to the alternate embodiment in FIG. 7 using feedback from the overcurrent protection control section to the input control section.

Bistate data bits generated by an external bit generator are coupled to the input of the logic driver circuit. Each data bit is simultaneously applied to an input of NAND gate 300 and NOR gate 302. The other inputs of NAND gate 300 and NOR gate 202 are respectively coupled to the outputs of AND gate 304 and NAND gate 306. One input to AND gate 304 is the source HI-Z input signal while one input to NAND gate 306 is the sink HI-Z input signal. The other input of AND gate 304 and NAND gate 306 are coupled to the output of NAND gate 308. An externally applied driver shutdown enable signal and an overcurrent indicator signal are coupled to the inputs of NAND gate 308. The driver shutdown enable signal is provided as a logic high when a driver shutdown is desired upon an overcurrent indication. If the driver shutdown enable signal is provided as a logic low, then the driver will not be automatically shut down in an overcurrent situation. However, in this mode, the "using system" could monitor the overcurrent indicate signal and provide control driver shutdown under system control. The overcurrent indicator signal is provided when an overcurrent condition occurs and is described later.

The output of NAND gate 300 is coupled to the cathode of diode 329. The anode of diode 329 is coupled to ground. Diode 329 is required when NAND gate 300 is implemented with a device that cannot source current in the logic low level or "0" state.

The output of NAND gate 300 is also coupled to the cathode of zener diode 310. The anode of zener diode 310 is coupled to the base of transistor 312. Transistors 312 and 314 and their associated bias circuitry form a differential amplifier.

The base of transistor 312 is coupled through bias resistor 316 to an external power supply (not shown) which provides the negative reference voltage $-V_{EE}$. The reference voltage $-V_{EE}$ is also coupled through resistor 218 to the emitter of transistor 312. The collector of transistor 312 is connected to ground and another differential amplifier as described later.

The emitter of transistor 314 is coupled to the emitter of transistor 312 with the reference voltage $-V_{EE}$ being provided to the emitter of transistor 314 through resistor 318. The base of transistor 314 coupled to an external power source (not shown) which provides the negative reference voltage $-V_{BB}$. The base of transistor 314 is also coupled t ground through filter capacitor 320. The collector of transistor 314 is coupled to the source driver circuitry, described later, and a source feed forward compensation circuit.

The source feed forward compensation circuit includes AND gate 322 having one input coupled to the output of NAND gate 300. AND gate 322 has its other input for receiving a bistate source feed forward compensation signal. The output of NAND gate 322 is coupled to the collector of transistor 314 through capacitor 324. The feed forward compensation circuit when enabled, provides increased switching speed, and lower input to output propagation delays. Although the feed forward compensation circuit again is illustrated as the basic compensation circuit described with reference to FIG. 2, other forms as discussed may be utilized.

The sink switching circuitry is controlled by the output of NOR gate 302 which is coupled to the anode of zener diode 326. In addition, the output of NOR gate 302 is coupled to the anode of tie-up diode 328 which has its anode coupled to an external power source (not shown) which provides the reference voltage $+V_{CC}$. Diode 328 is utilized to limit positive voltage to a diode drop above $+V_{CC}$. This is required if NOR gate 302 is implemented with a device that cannot sink current in the logic "1" state.

The cathode of zener diode 326 is coupled to the base of transistor 330. Transistors 330 and 332 and their associated bias circuitry form a differential amplifier.

The base of transistor 330 is coupled through bias resistor 334 to an external power supply (not shown) which provides the reference voltage $+V_{EE}$. The emitter of transistor 330 is also coupled to the reference voltage $+V_{EE}$ through resistor 336. The collector of transistor 330 is connected to the collector of transistor 312 with the collectors of both transistors being coupled to ground.

The base of transistor 332 is coupled to an external power supply (not shown), which provides the reference voltage $+V_{BB}$. In addition, the base of transistor 332 is coupled to ground through filter capacitor 338. The emitter of transistor 330 is coupled to the emitter of transistor 332. The collector of transistor 332 is coupled to the sink driver circuitry, described later, and the sink feed forward compensation circuit.

The sink feed forward compensation circuit includes AND gate 340 having one input coupled to the output of NOR gate 302. AND gate 340 has its other input for receiving a bistate sink feed forward compensation signal. The output of AND gate 340 is coupled through capacitor 342 to the collector of transistor 332. The sink feed forward compensation circuit when enabled, provides increased switching speed, and lower input to output propagation delays. Although the feed forward compensation circuit again is illustrated as the basic compensation circuit described with reference to FIG. 2, other forms as discussed may be utilized. The source differential amplifier circuitry is coupled to the source switching element which is comprised of drive transistor 344. In particular, the collector of transistor 314 is connected to the base of a PNP transistor, drive transistor 344. Resistor 346 is coupled across the emitter and base of transistor 344. Schottky diode 348 is coupled with its anode and cathode respectively connected to the collector and base of drive transistor 344.

The emitter of transistor 344 is coupled to ground through capacitor 350. The emitter of transistor 344 is also coupled through sense resistor 352 to a positive voltage programmable power supply (not shown) which provides the programmable positive reference voltage $+PV$. This voltage appears at the collector of transistor 344 when transistor 344 is on.

The sink switching circuitry is complementary to that of the source switching circuitry just described. The collector of transistor 332 is connected to the base of a NPN transistor, drive transistor 354. Resistor 356 is coupled across the emitter and base of transistor 354. Schottky diode 358 is coupled with its cathode and anode respectively connected to the collector and base of drive transistor 354.

The emitter of transistor 354 is coupled to ground through capacitor 360. The emitter of transistor 354 is coupled through sense resistor 362 to a negative voltage programmable power supply (not shown) which provides the programmable negative reference voltage $-PV$. This voltage therefore appears at the collector of transistor 354 when transistor 354 is on. The collector of transistor 354 is connected t the collector of transistor 344 with the collectors of both transistors forming the logic driver output. Capacitor 364 is connected between the bases of transistors 344 and 354.

The overcurrent protection circuitry for the source switching element, drive transistor 344, consists of a comparator circuit. Comparator 366 has an inverting input coupled to the end of sense resistor 352 coupled to the source of the reference voltage $+PV$. The non-inverting input of comparator 366 is coupled to the anode of diode 368. The cathode of diode 368 is coupled to the other end of sense resistor 352 that is coupled to the emitter of transistor 344. The non-inverting input of comparator 366 is also coupled through bias resistor 370 to the external power supply which provides the reference voltage $+V_{DD}$ to ground through capacitor 372. The voltage $+V_{DD}$ is of a positive voltage greater than the voltage $+PV$ to keep diode 368 forward biased.

The output of comparator 366 is coupled to a set input, $S_1$, of flip-flop 374. Flip-flop 374 provides at the Q output a bistate Q output signal that is in one state during normal operation of the driver circuit. Flip-flop 374 provides an overcurrent indicate signal as the other state of the Q output signal when an overcurrent condition occurs at the source switching element output. The Q output of flip-flop 374 is coupled to the input of NAND gate 308.

The overcurrent protection circuitry for the sink switching element, drive transistor 354, also consists of a comparator circuit. Comparator 376 has a non-inverting input coupled to the end of resistor 362 coupled to the source of the reference voltage $-PV$. The inverting input of comparator 376 is coupled to the cathode of diode 378. The anode of diode 378 is coupled to the other end of resistor 362 that is coupled to the emitter of transistor 354. The inverting input of comparator 376 is coupled through bias resistor 380 to an external power supply (not shown) which provides the negative reference voltage $-V_{DD}$ and to ground through capacitor 382. The voltage $-V_{DD}$ is of voltage greater (more negative) than the voltage $-PV$.

The output of the comparator 376 is coupled to a set input, $S_2$, of flip-flop 374. Flip-flop 374 again provides an overcurrent indicate signal as the other state of the Q output signal when an overcurrent condition occurs at the sink switching element output.

Flip-flop 374 also has a reset input, R, at which a bistate overcurrent reset signal may be provided to reset the flip-flop. The reset signal, normally in one state, is provided in the other state to reset flip-flop 374 after it has changed state as the result of an overcurrent condition. Flip-flop 374 is reset for normal operating condition so that the driver output may be controlled in response to the data input and HI-Z input signals. As was discussed with reference to FIG. 8, the source HI-Z and sink HI-Z inputs provide signals which selectively turns off the drive transistors.

The circuit as described with reference to FIG. 9 uses bipolar complementary transistors, transistors 344 and 354, as the output switching elements. They are again driven by source and sink differential amplifiers respectively comprised of transistor pair 312, 314 and transistor pair 330, 332. Zener diodes 310 and 326 provide the voltage translation function between the differential amplifiers and the input logic gates.

In the output driver circuitry, schottky diodes 348 and 358 speed switching by preventing transistors 344 and 354 from saturating. Capacitor 364 provides dynamic crosscoupling between transistors 344 and 354 so as to smooth the transistors turn on and turn off transitions. In addition, capacitor 364 equalizes the input to output propagation delays for both positive and negative transitions.

Speed enhancement for each switching element is achieved by the use of a capacitive feed forward compensation circuit. Capacitors 324 and 342 are programmed via the respective driving logic gates, AND gates 322 and 340, which establish a voltage on capacitors so as to couple transition energy, in advance of the normal switching path, from outputs of NAND and NOR gates 300 and 302, to the bases of output switching transistors 344 and 354.

In the overcurrent protection circuit of FIG. 9, an overcurrent condition occurs when the voltage drop across either of sense resistors 352 and 362 exceeds a predetermined voltage threshold. This voltage threshold is the voltage drop across diodes 368 and 378. In response to the threshold voltage across resistors 352 and 362 being exceeded, a respective comparator switches from a normally high output to a low output. A low output from either comparator sets flip-flop 374 to an output state that indicates an overcurrent condition. The low state of the latch output propagated through the following logic circuitry turns off both switching transistors 344 and 354. The low state of the overcurrent reset input signal to flip-flop 374 resets flip-flop 374 for normal operation. The overcurrent reset signal may b provided manually, or automatically by an ATE system computer.

The previous description of the preferred embodiments are provided to enable any person skilled in the art to make or use the present invention. Various modifications to these embodiments will be readily apparent to those skilled in the art, and the generic principles defined herein may be applied to other embodiments without the use of the inventive faculty. Thus, the present invention is not intended to be limited to the embodiment shown herein, but is to be accorded the widest scope consistent with the principles and novel features disclosed herein.

What is claimed is:

1. A logic driver comprising:
control means for receiving input power and an input bistate data bit and responsive to first and second states of said input bistate data bit for providing output power at corresponding first and second predetermined voltage levels, said control means having feed forward compensation means for modifying the response time of said control means for providing output power in response to said input bistate data bit;
sense means coupled to said control means for detecting the level of current in said input power and providing a corresponding current level indication; and
overcurrent means, responsive to said current level indication, for generating an overcurrent command when said input power current level exceeds a predetermined level, said control means responsive to said overcurrent command for disabling the output of power at the corresponding predetermined voltage level at said output.

2. The logic driver of claim 1 wherein said control means is further responsive to an input disable command for disabling the providing of output of power at a selected predetermined voltage level.

3. The logic driver of claim 1 wherein said sense means comprises a pair of sensors, each sensor responsive to the level of current corresponding to a different one of said first and second predetermined voltage levels in said output power for generating a corresponding current level signal as said current level indication.

4. The logic driver of claim 3 wherein said overcurrent means comprises a pair of overcurrent controllers each responsive to a different one of said current level signals for providing a corresponding overcurrent signal as said overcurrent command to said control means when said output current exceeds a predetermined level.

5. A logic driver for providing output power, received as input power from an external power source, said output power switched between two voltage levels in response to an input bistate data bit, comprising:
input means for receiving an input bistate data bit and generating a control command corresponding to the state of an input bistate data bit;
feed forward compensation means coupled to said input means and responsive to a change in said control command for generating a transitional control command;
switch means for receiving input power, said switch means responsive to said transitional control command and said control command for providing output power to an output at a first predetermined voltage level when n input bistate data bit is of a first state and at a second predetermined voltage level when an input bistate data bit is of a second state, said switch means receiving said transitional control command in advance of said control command;
sense means coupled to said switch means for detecting a level of current in said input power and providing a corresponding current level indication; and
overcurrent means, responsive to said current level indication, for generating an overcurrent command when said current level indication exceeds a predetermined level, said switch means being further responsive to said overcurrent command for disabling the providing of output power at the corresponding predetermined voltage level.

6. The logic driver of claim 5 wherein said sense means comprises a pair of sensors each couple to said switch means with each sensor responsive to the level of current in said input power corresponding to a different one of said first and second predetermined voltage levels in said output power for generating a corresponding current level signal as said current level indication.

7. The logic driver of claim 6 wherein said overcurrent means comprises a pair of overcurrent controllers each coupled to said switch means and a different sensor, each responsive to a corresponding current signal for generating a corresponding overcurrent signal as said overcurrent command, said switch means responsive to each overcurrent signal for disabling the output of power at the corresponding predetermined voltage level at said output power sources.

8. The logic driver of claim 5 wherein said feed forward compensation means comprises:
capacitive means for coupling transitional energy, corresponding to changes in said control command, as said transitional control command to said switch means; and programmable control means coupled to said capacitive means for selectively enabling the coupling of transitional energy by said capacitive means to said switch means.

9. The logic driver of claim 5 wherein said input means comprises:
input control means for receiving an input bistate data bit, for performing predetermined boolean logic operations on an input bistate data bit, and for providing a corresponding pair of output bistate logic signals; and
interface means for receiving said pair of output bistate logic signals and converting the state of each logic signal to a corresponding analog signal with each pair of converted logic signals forming said control command.

10. The logic driver of claim 5 wherein said input means is further responsive to an input disable command for modifying said control command, said switch means responsive to said modified control command for disabling the output of power at a selected one of said first and second voltage level predetermined at said output.

11. The logic driver of claim 10 wherein said input means comprises:
input control means for, receiving an input bistate data bit and an input disable command in the form of a pair of bistate disabled signals, performing predetermined boolean logic bistate disable signals and providing a corresponding output pair of bistate logic signals; and
interface means for receiving said output pair of bistate logic signals and converting the state of each logic signal to a corresponding analog signal with each pair of converted logic forming one of said control command and said modified control command.

12. The logic driver of claim 10 wherein said switch means comprises:
switch control means responsive to said control command, said modified control command and said overcurrent command for generating a pair of switch control signals; and
a pair of switch element means each responsive to a different switch control signal and each for, receiving power from an external power source at a different one of said first and second predetermined voltage levels and selectively providing output power at a different one of said first and second predetermined voltage levels.

13. The logic driver of claim 9 wherein said switch means comprises:
switch control means responsive to each pair of converted logic signals and said overcurrent command for generating a pair of switch control signals; and
a pair of switch element means each responsive to a different one of said pair of switch control signals and each for receiving power from an external power source at a different one of said first and second predetermined voltage levels and selectively providing output power at a different one of said first and second predetermined voltage levels.

14. The logic driver of claim 13 wherein said sense means comprises a pair of sensors each coupled to a different switch element means of said pair of switch element means with each sensor providing a current level signal representative of the current provided from an external power source to a corresponding switch element means.

15. The logic driver of claim 14 wherein said overcurrent means comprises a pair of overcurrent controllers each coupled to a different sensor and switch means, each overcurrent controller responsive to a corresponding current level signal so as to generate overcurrent signal provided to a corresponding one of said switch element means when the output power current level exceeds a predetermined level, each switch element means responsive to a corresponding overcurrent signal for disabling the output of power.

16. A logic driver for providing output power received as input power from an external power source, said output power switched between two voltage levels in response to an input bistate data bit, comprising:
input means for receiving an input bistate data bit and generating a control command corresponding to the state of an input bistate data bit;
feed forward compensation means coupled to said input means and responsive to a change in said control command for generating a transitional control command;
switch means for receiving input power, said switch means responsive to said transitional control command and said control command for, providing output power to an output at a first predetermined voltage level when an input bistate data bit is of a first state and at a second predetermined voltage level when an input bistate data bit is of a second state, said switch means receiving said transitional control command in advance of said control command;
sense means coupled to said switch means for detecting a level of current in said input power and providing a corresponding current level indication; and
overcurrent means, responsive to said current level indication, for generating an overcurrent command when said current level indication exceeds a predetermined level, said input means being further responsive to said overcurrent command for modifying said control command, said switch means responsive to said modified control command for disabling the providing of output power at the corresponding predetermined voltage level.

17. The logic driver of claim 16 wherein said sense means comprises a pair of sensors each coupled to said switch means with each sensor responsive to the level of current in said input power corresponding to a different one of said first and second predetermined voltage levels in said output power for generating a corresponding current level signal as said current level indication.

18. The logic driver of claim 17 wherein said overcurrent means comprises a pair of overcurrent controllers each coupled to said switch means and a different sensor, each overcurrent controller responsive to a corresponding current level signal for generating a corresponding overcurrent signal as said overcurrent command, said switch means responsive to each overcurrent signal for disabling the output of power at the corresponding predetermined voltage level at said output.

19. The logic driver of claim 16 wherein said feed forward compensation means comprises:
capacitive means for coupling transitional energy, corresponding to changes in said control command, as said transitional control command to said switch means; and programmable control means coupled to said capacitive means for selectively enabling the coupling of transitional energy by said capacitive means to said switch means.

20. The logic driver of claim 16 wherein said input means comprises:

input control means for receiving an input bistate data bit and an overcurrent command in the form of a pair of bistate overcurrent signals, for performing predetermined boolean logic on an input bistate data bit and a pair of input bistate overcurrent signals, and providing a corresponding pair of output bistate logic signals, and interface means for receiving said pair of output bistate logic signals and converting the state of each output logic signal to a corresponding analog signal with each converted logic signals forming said control commands.

21. The logic driver of claim 18 wherein said input means is further responsive to an input disable command for modifying said control command, said switch means responsive to said modified control command for disabling the output of power at a selected one of said first and second predetermined voltage level at said output.

22. The logic driver of claim 21 wherein said input means comprises:

input control means for receiving an input bistate data bit, an input disable command in the form of a pair of bistate disable signals and an overcurrent command in the form of a pair of bistate overcurrent signals performing predetermined boolean logic on an input bistate data bit, a pair of input bistate disable signals and a pair of input bistate overcurrent signals, and providing a corresponding output pair of bistate logic signals; and interface means for receiving said output pair of bistate logic signals and converting the state of each logic signal to a corresponding analog signal with each of converted logic signals forming one of said control commands and said modified control command.

23. The logic driver of claim 21 wherein said switch means comprises:

switch control means responsive to said control command and said modified control command for generating a pair of switch control signals; and a pair of switch element means each responsive to a different switch control signal and each for, receiving power from an external power source and at a different on of said first and second predetermined voltage levels and selectively providing output power at a different one of said first and second predetermined voltage levels.

24. The logic driver of claim 20 wherein said switch means comprises:

switch control means responsive to each pair of converted logic signals for generating a pair of switch control signals; and a pair of switch element means each responsive to a different one of said pair of switch control signals and each for, receiving power from an external power source at a different one of said first and second predetermined voltage levels and selectively providing output power at a different one of said first and second predetermined voltage levels.

25. The logic driver of claim 24 wherein said sense means comprises a pair of sensors each coupled to a different switch element means with each sensor providing a current level signal representative of the current provided from an external power source to a corresponding switch element means.

26. The logic driver of claim 24 wherein said overcurrent means comprises a pair of overcurrent controllers each coupled to a different sensor and switch element means, each overcurrent controller responsive to a corresponding current level signal so as to generate a bistate overcurrent signal provided to said input control means when the output power current level exceeds a predetermined level, said input control means responsive to an overcurrent signal providing said bistate logic signal of a state converted by said interface means and provided to said switch control means for generating a switch control signal to a corresponding switching element means for disabling the output of power.

27. A feed forward compensation circuit for connecting between the output of a transmitting circuit and the input of a receiving circuit connected by a conductive path having signal transmission time delays, for selectively coupling transitional energy corresponding to changes in state of a multistate output signal at said transmitting circuit output to said receiving circuit input, said feed forward compensation circuit comprising:

a logical AND gate having a pair of inputs and an output, one AND gate input connected to an output of a transmitting circuit and said other AND gate input connected to receive an AND gate bistate enable signal; and a capacitor having a pair of terminals, one capacitor terminal connected to said AND gate output and said other capacitor terminal connected to an input of a receiving circuit.

28. The compensation circuit of claim 27 wherein said AND gate and capacitor from a first compensation channel and wherein said compensation circuit further comprises at least one additional compensation channel each having an additional logical AND gate having a pair of inputs and an output, one of each additional channel AND gate inputs connected to said transmitting circuit output and said other one of each additional AND gate inputs connected to receive a respective additional AND gate bistate enable signal, and an additional channel capacitor having a pair of terminals, one of each additional channel capacitor terminals connected to a corresponding additional channel AND gate output and said other one of each additional channel capacitor terminals connected to said receiving circuit input.

29. The compensation circuit of claim 27 further comprising a logical inverter gate disposed between said transmitting circuit output and said AND gate input, and said inverter gate having an input and an output with said inverter gate input connected to said transmitting circuit output and said inverter gate output connected to said one input of said AND gate inputs.

30. The compensation circuit of claim 27 further comprising a logical EXCLUSIVE OR gate disposed between said transmitting circuit output and said AND gate, said EXCLUSIVE OR gate having a pair of inputs and an output with one of said EXCLUSIVE OR gate inputs connected to said transmitting circuit output and the other one of said EXCLUSIVE OR gate inputs connected to receive EXCLUSIVE OR gate bistate enable signal, and said EXCLUSIVE OR gate output connected to said one input of said AND gate inputs.

31. The compensation circuit of claim 28 further comprising a logical EXCLUSIVE OR gate disposed between said transmitting circuit output and said AND gate, said EXCLUSIVE OR gate having a pair of inputs and an output with one of said EXCLUSIVE OR gate inputs connected to said transmitting circuit output and the other one of said EXCLUSIVE OR gate inputs connected to receive EXCLUSIVE OR gate bistate enable signal, and said EXCLUSIVE OR gate output connected to said one input of said AND gate inputs.

32. The compensation circuit of claim 28 wherein at least one of said additional compensation circuit channels further comprises an additional channel logical EXCLUSIVE OR gate having a pair of inputs and an output, each disposed between said transmitting circuit output and a corresponding additional channel AND gate with one of each additional channel EXCLUSIVE OR gate inputs connected to said transmitting circuit output and said other one of each additional channel EXCLUSIVE OR gate inputs connected to receive a respective additional channel EXCLUSIVE OR gate bistate enable signal, and each additional channel EXCLUSIVE OR gate output connected to a corresponding additional channel AND gate one input.

33. The compensation circuit of claim 31 wherein at least one of said additional compensation circuit channels further comprises an additional channel logical EXCLUSIVE OR gate having a pair of inputs and an output, each disposed between said transmitting circuit output and a corresponding additional channel AND gate with one of each additional channel EXCLUSIVE OR gate inputs connected to said transmitting circuit output and said other one of each additional channel EXCLUSIVE OR gate inputs connected to receive a respective additional channel EXCLUSIVE OR gate bistate enable signal, and each additional channel EXCLUSIVE OR gate output connected to a corresponding additional channel AND gate one input.

* * * * *